US011313396B2

(12) United States Patent
Lin

(10) Patent No.: US 11,313,396 B2
(45) Date of Patent: Apr. 26, 2022

(54) BASE FASTENER

(71) Applicant: ASIA VITAL COMPONENTS CO., LTD., New Taipei (TW)

(72) Inventor: Sheng-Huang Lin, New Taipei (TW)

(73) Assignee: ASIA VITAL COMPONENTS CO., LTD., New Taipei (TW)

( * ) Notice: Subject to any disclaimer, the term of this patent is extended or adjusted under 35 U.S.C. 154(b) by 178 days.

(21) Appl. No.: 16/384,942

(22) Filed: Apr. 16, 2019

(65) Prior Publication Data

US 2020/0232492 A1     Jul. 23, 2020

(30) Foreign Application Priority Data

Jan. 22, 2019  (TW) .................................. 108102355

(51) Int. Cl.
*F16B 5/00*     (2006.01)
*F16B 5/06*     (2006.01)
*H05K 1/02*     (2006.01)

(52) U.S. Cl.
CPC ......... *F16B 5/0657* (2013.01); *H05K 1/0203* (2013.01); *H05K 2201/066* (2013.01); *H05K 2201/10409* (2013.01); *H05K 2201/10424* (2013.01)

(58) Field of Classification Search
None
See application file for complete search history.

(56) References Cited

U.S. PATENT DOCUMENTS

| 4,199,124 | A |  | 4/1980 | Tachida |  |
|---|---|---|---|---|---|
| 2013/0075567 | A1 | * | 3/2013 | Fu | H01L 23/4006 248/346.04 |
| 2014/0161558 | A1 | * | 6/2014 | Hayashi | F16B 43/00 411/366.1 |
| 2016/0174377 | A1 | * | 6/2016 | Chuah | H04M 1/0277 361/784 |
| 2018/0139866 | A1 | * | 5/2018 | Tian | H01L 23/34 |
| 2018/0160524 | A1 | * | 6/2018 | Barron | H05K 1/181 |
| 2019/0306985 | A1 | * | 10/2019 | Ferguson | H01R 12/88 |

FOREIGN PATENT DOCUMENTS

| CN | 200979915 Y | 11/2007 |
|---|---|---|
| CN | 101141864 A | 3/2008 |
| CN | 201123199 Y | 9/2008 |
| CN | 101541158 A | 9/2009 |
| CN | 101660561 A | 3/2010 |
| CN | 102056458 A | 5/2011 |
| CN | 202153513 U | 2/2012 |
| CN | 102686058 A | 9/2012 |

(Continued)

*Primary Examiner* — Steven M Marsh
(74) *Attorney, Agent, or Firm* — Demian K. Jackson; Jackson IPG PLLC

(57) ABSTRACT

The present invention relates to a base fastener which is disposed corresponding to a pair of arc holes on a base. The base fastener comprises a body. The body has a first side, a second side, and a throughhole. The throughhole penetrates through the first side and the second side. A first post and a second post protrude from the second side beside the throughhole. The first post, the second post, and the pair of arc holes are disposed correspondingly and rotatably connected to each other to be assembled with the base firmly.

4 Claims, 9 Drawing Sheets

(56) References Cited

FOREIGN PATENT DOCUMENTS

| | | |
|---|---|---|
| CN | 102832184 A | 12/2012 |
| CN | 104852192 A | 8/2015 |
| CN | 104936414 A | 9/2015 |
| CN | 206100744 U | 4/2017 |
| CN | 106922102 A | 7/2017 |
| CN | 206350647 U | 7/2017 |
| CN | 107635429 A | 1/2018 |
| CN | 207969265 U | 10/2018 |
| CN | 209749027 U | 12/2019 |
| JP | 2001248613 A | 9/2001 |
| TW | M577636 U | 5/2019 |

* cited by examiner

BASE FASTENER

This application claims the priority benefit of Taiwan patent application number 108102355 filed on Jan. 22, 2019.

BACKGROUND OF THE INVENTION

Field of the Invention

The present invention relates to a base fastener and, in particular, to a base fastener which is used as an intermediate object for other screws or fasteners to be fixed on the base.

Description of Prior Art

The electronic apparatus is equipped with various electronic devices that are responsible to perform different operations for the electronic apparatus. In particular, the central processing unit or other chips generate considerable heat during operation and require additional heat dissipating devices to prevent the central processing unit or other chips from burning out.

The commonly used heat dissipating device can be the cooler, the vapor chamber, or the cooling fins. In addition, the heat dissipating device has to be tightly attached to the chips, the central processing unit, or the heat source for seamless contact such that the heat can be dissipated with a minimal thermal resistance caused by the gap. In general, the heat dissipating device is fixed to the motherboard using screw units. The motherboard uses another screw unit penetrating from the opposite side to couple the nut units with internal threads disposed on the heat dissipating device to achieve the fixing between the motherboard and the heat dissipating device. In addition, the nut units disposed on the heat dissipating device are required to remain temporarily on the heat dissipating device by means of nut washer units to avoid separation. The nut washer unit is made of plastic and has at least two extending projections. The extending projections are used to pass through the throughholes which are pre-formed for the penetration and fastening of the extending projections on the heat dissipating device. Then, the ends of the extending projections are flattened with the high-temperature melting to form the stoppers which can prevent the extending projections from being pulled out and fix the nut washer units to the heat dissipating device.

However, the design of the extending projections encounters the following problems. The high-temperature melting and the cooling process individually take much time. Also, it is a complicated and time-consuming process to deflash the extending projections after the high-temperature melting process. The reworking cannot be performed. Thus, to overcome the above disadvantages of the prior art is the target to be reached by the present invention.

SUMMARY OF THE INVENTION

To solve the above-mentioned problems effectively, the main objective of the present invention is to provide a base fastener which can improve the fast and reliable assembly between the nut washer and the heat dissipating device.

To achieve the above objective, the present invention provides a base fastener disposed corresponding to a pair of arc holes on a base. The base fastener comprises a body.

The body has a first side, a second side, and a throughhole. The throughhole penetrates through the first side and the second side. A first post and a second post protrude from the second side beside the throughhole. The first post, the second post, and the pair of arc holes are disposed correspondingly and are rotatably connected to each other.

By means of the base fastener of the present invention, which provides a fast and simple way of assembly and disassembly for the base, the complicated manufacturing process and the failure in reworking associated with the prior art can be improved.

DETAILED DESCRIPTION OF THE INVENTION

The above objective, structural and functional characteristics of the present invention will be described according to the preferred embodiments with the accompanying figures.

Figure 1:
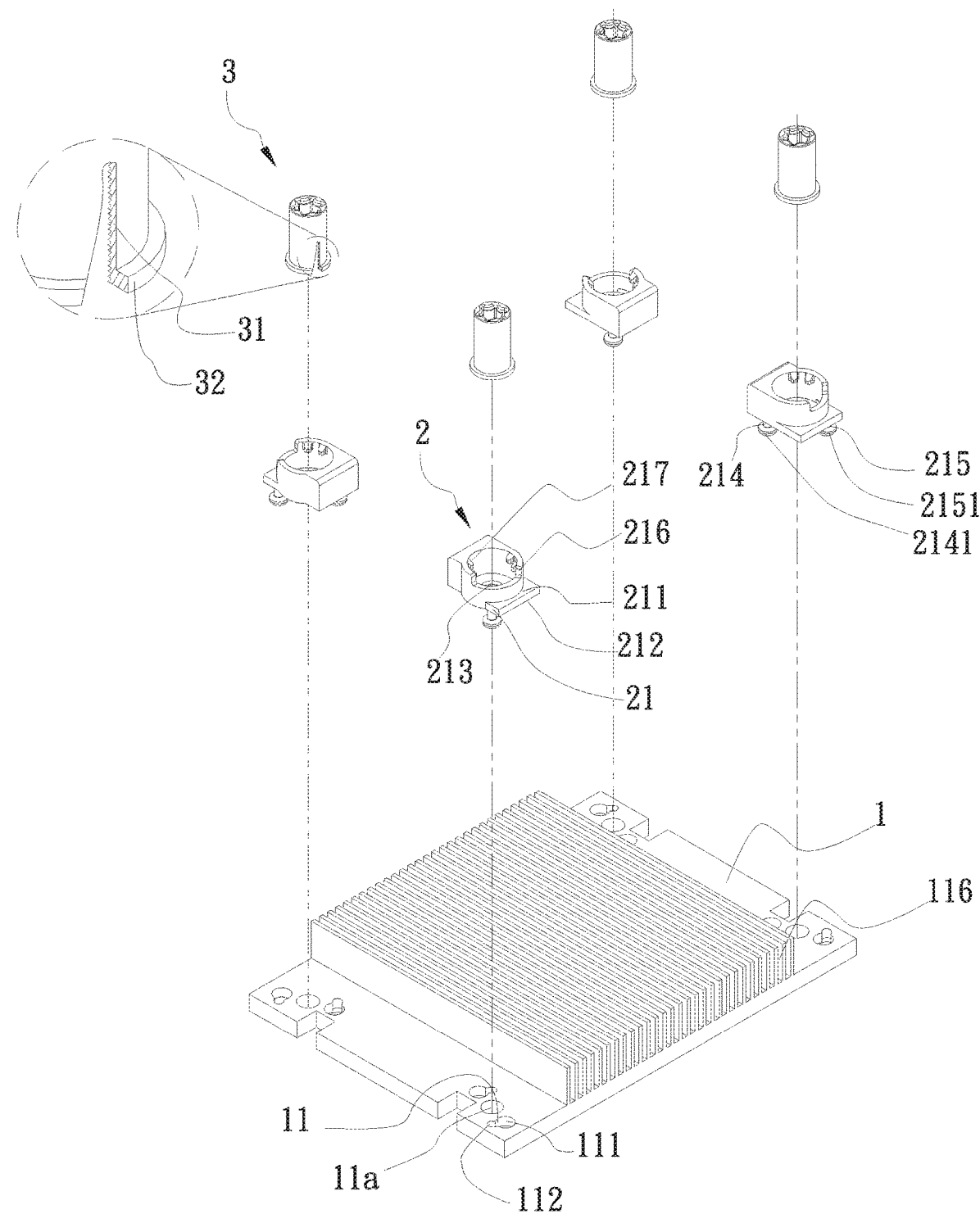
FIG. 1 is a perspective exploded view of the base fastener according to the first embodiment of the present invention.
Figure 2:
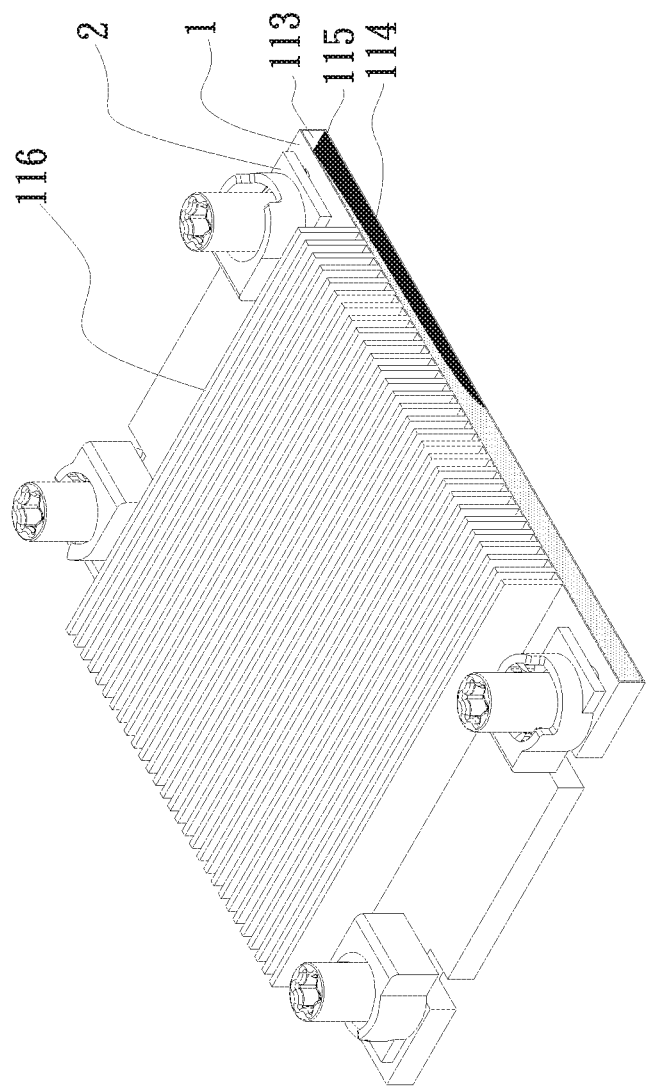
FIG. 2 is a perspective assembled view of the base fastener according to the first embodiment of the present invention.

Please refer to FIGS. 1 and 2, which are the perspective exploded view and the perspective assembled view of the base fastener according to the first embodiment of the present invention, respectively. As shown in FIGS. 1 and 2, the base fastener 2 of the present invention, which is disposed corresponding to a pair of arc holes 11 of a base 1. The base fastener 2 comprises a body 21.

The body 21 has a first side 211, a second side 212, and a throughhole 213. The throughhole 213 penetrates through the first side 211 and the second side 212. A first post 214 and a second post 215 protrude from the second side 212 beside the throughhole 213. The first post 214, the second post 215, and the pair of arc holes 11 are disposed correspondingly and rotatably connected to each other. The sidewall 216 protrudes from the edge of the throughhole 213; the limiting portion 217 is disposed on the inner edge of the sidewall 216. The limiting portion 217 is composed of at least one projection protruding radially from the inner edge of the sidewall 216.

An end of the nut 3 is inserted into the sidewall 216 around the throughhole 213 of the body 21. The nut 3 has an internal thread 31 and a flange 32 disposed at the end thereof inserted into the sidewall 216. The flange 32 is confined axially through the limiting portion 217.

The pair of arc holes 11 are disposed correspondingly on the base 1. Each of the pair of arc holes 11 has a first arc position 111 and a second arc position 112. The first arc position 111 and the second arc position 112 communicate with each other. An opening 11a is disposed between the pair of arc holes 11.

A first end 2141 is formed at the end of the first post 214; the width of the first end 2141 is larger than the diameter of the first post 214. A second end 2151 is formed at the end of the second post 215; the width of the second end 2151 is larger than the diameter of the second post 215. The widths of the first end 2141 and the second end 2151 are larger than the width of the second arc position 112 of the arc hole 11. Each of the first end 2141 and the second end 2151 has a circular shape, a square shape, a triangle shape, or any other shape. The shapes of the first end 2141 and the second end 2151 are corresponding to those of the first arc position 111 and the second arc position 112 of each of the pair of arc holes 11.

The base 1 is made of thermal conductive material and may have a chamber 113 in which a wick structure 114 and a working fluid 115 are disposed. A plurality of cooling fins 116 may extend from or a heat pipe may be disposed on a side of the base 1. The base 1 can be replaced with any other heat dissipating device such as a vapor chamber, a cooling plate, or a two-phase substance.

The first post 214 and the second post 215 individually pass through the first arc positions 111 of the pair of arc holes 11 and rotate toward the second arc positions 112 such that the base fastener 2 is fixed to the base 1.

Figure 3:
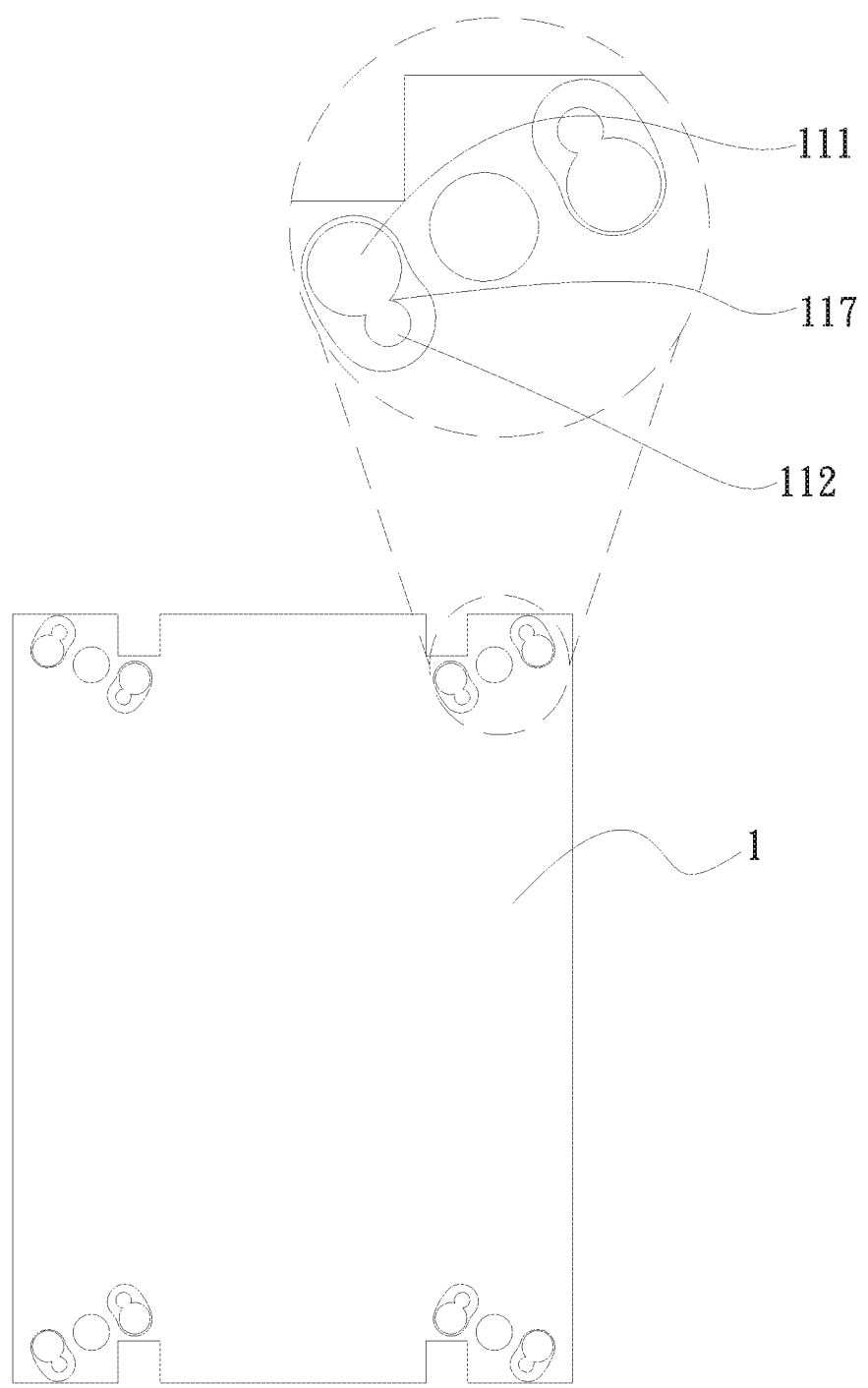
FIG. 3 is a schematic view of the base fastener according to the second embodiment of the present invention.

Please refer to FIG. 3, which is a schematic view of the base fastener according to the second embodiment of the present invention, FIG. 1, and FIG. 2. Some structures of the current embodiment in FIG. 3 are identical to those of the first embodiment and will not be described again here. The difference is that, in the second embodiment, a neck portion 117 is disposed near the second arc position 112 of each of the pair of the arc holes 11 on the base 1. The width of the neck portion 117 is less than the widths of the first arc position 111, the second arc position 112, the first post 214, and the second post 215 such that the radial rotations of the first post 214 and the second post 215 are confined by the neck portion 117.

Figure 4:
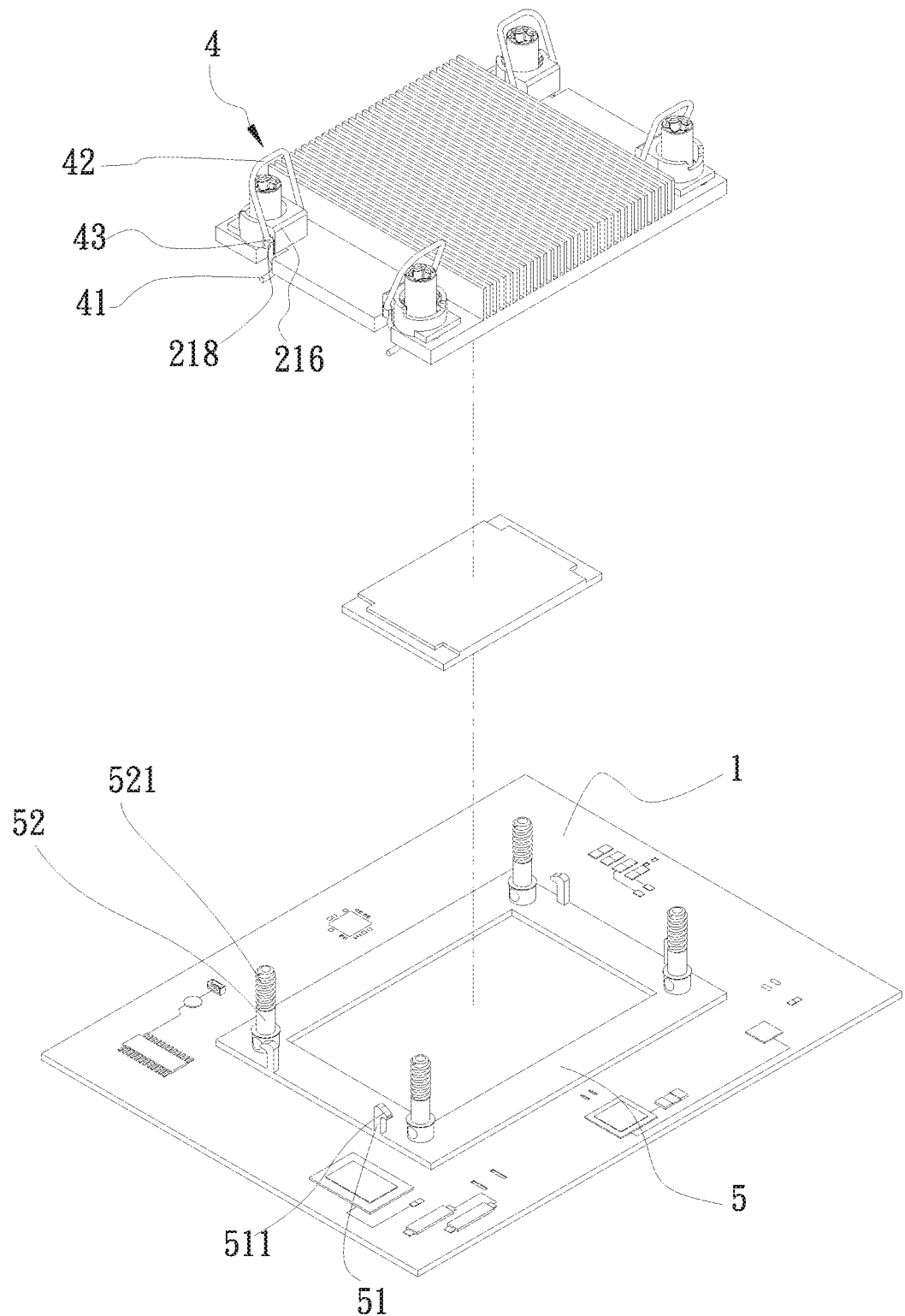
FIG. 4 is a schematic view of the base fastener according to the third embodiment of the present invention.
Figure 5A:
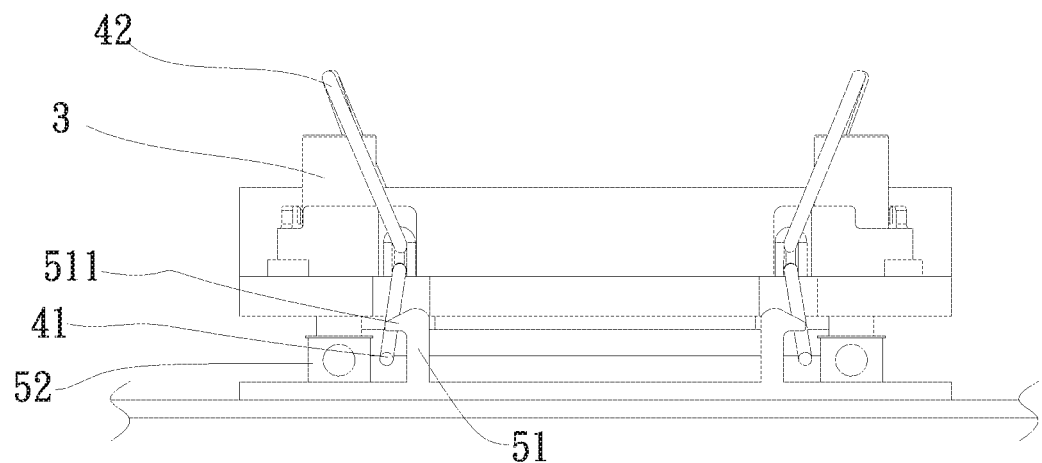
FIG. 5a is a schematic view of the base fastener according to the third embodiment of the present invention.
Figure 5B:
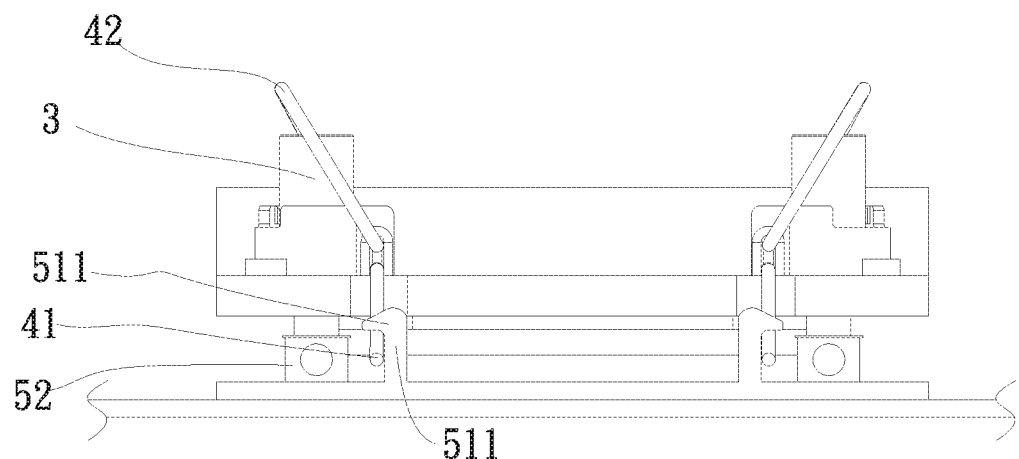
FIG. 5b is a schematic view of the base fastener according to the third embodiment of the present invention.

Please refer to FIGS. 4, 5a, and 5b, which are the schematic views of the base fastener according to the third embodiment of the present invention. As shown in FIGS. 4, 5a, and 5b, some structures of the third embodiment are identical to those of the first embodiment and will not be described again here. The difference is that, in the third embodiment, a hinge groove 218 is dispose on the outer edge of the sidewall 216.

The hook fastener 4 has a hook end 41, an operating portion 42, and a hinge end 43. The operating portion 42 has an inverse "U" shape. The hinge end 43 and the hook end 41 individually extend from two ends of the operating portion 42; the hinge end 43 and part of the hook end 41 are received in the hook groove 43.

A base frame 5 is disposed on the motherboard. The base 1 is disposed above the base frame 5. The base frame 5 has a plurality of projections 51 and a plurality of bolts 52 disposed vertically on a side of the base frame 5. The bolt 52 has the external thread 521 disposed on the outer surface thereof. Each projection 51 has a hook portion 511 disposed at an end thereof. The hook end 41 and the hook portion 511 of each of the projections 51 are hooked together (refer to FIG. 5b) or separated (refer to FIG. 5a) by means of the operating portion 42 of the hook fastener 4. The nuts 3 and the bolts 52 are screwed to each other.

Figures 6A, 6B, 6C:
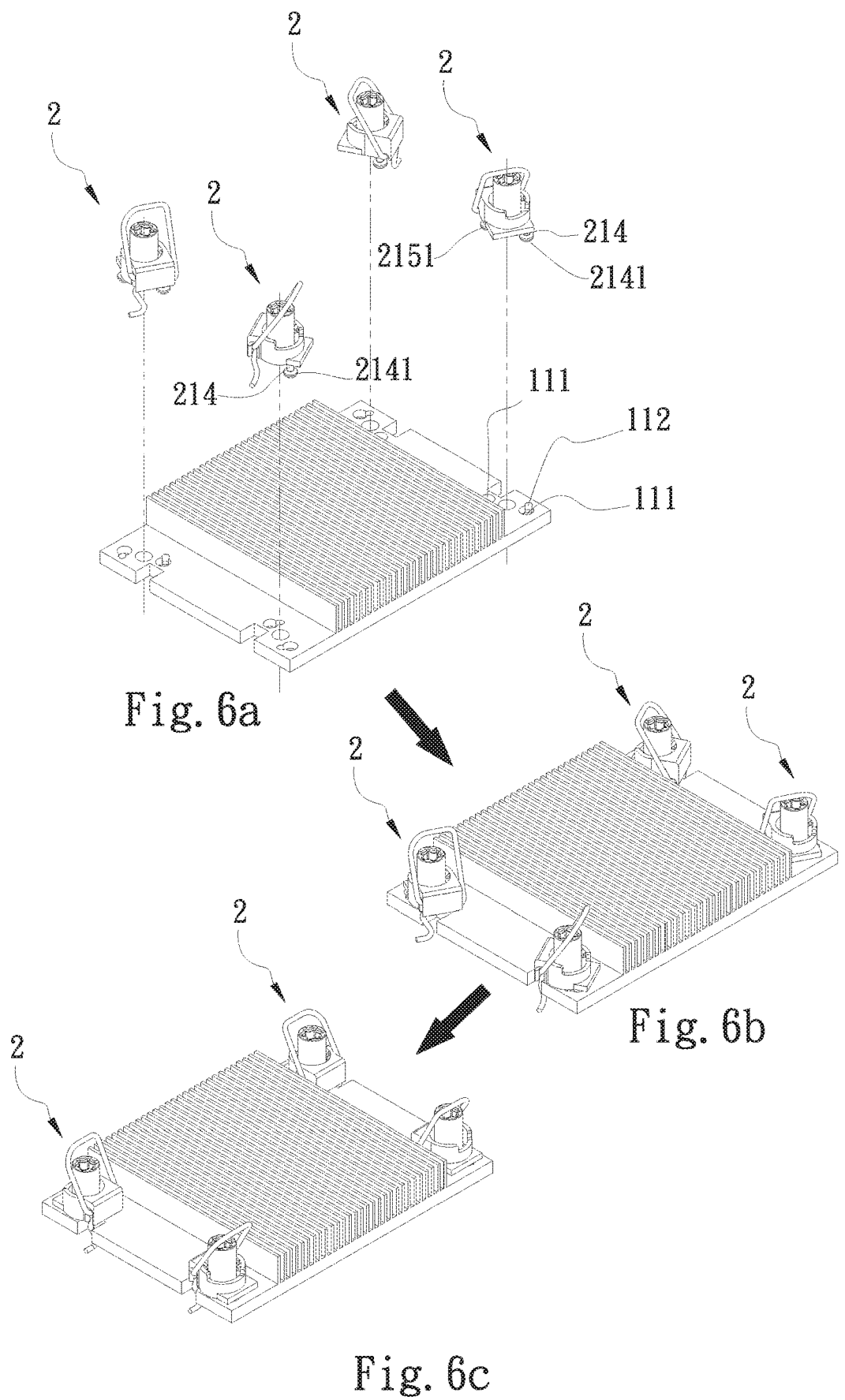
FIG. 6a is a schematic view of the base fastener of the present invention.
FIG. 6b is a schematic view of the base fastener of the present invention.
FIG. 6c is a schematic view of the base fastener of the present invention.
Figure 7:
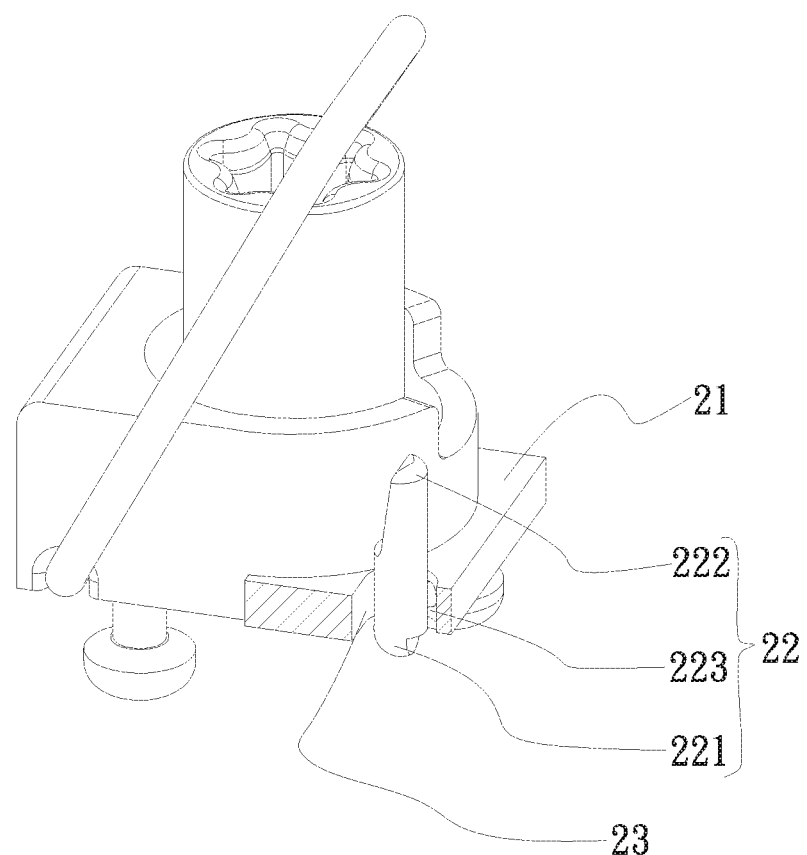
FIG. 7 is a perspective view of the base fastener according to the fourth embodiment of the present invention.

Please refer to FIGS. 6a, 6b, and 6c, which are the operational schematic views of the base fastener of the present invention, in addition to FIGS. 1-5. The main objective of the base fastener of the present invention 2 is to fix the nuts 3 on the base 1, as shown in FIG. 6a. The first post 214 and the second post 215 of the base fastener 2 are penetrated through the first arc positions 111 of the arc holes 11 (refer to FIG. 6b). Then, the base fastener 2 is rotated such that the first post 214 and the second post 215 move horizontally from the first arc positions 111 of the arc holes 11 toward the second arc positions 112. Because the widths of the first end 2141 of the first post 214 and the second end 2151 of the second post 215 are larger than that of the second arc position 112, the base fastener 2 is confined vertically to avoid being removed or separated and the nuts 3 are fixed to the base 1 through the base fasteners 2.

Please refer to FIGS. 7, 8a, 8b, 9a and 9b, which are the perspective view and the schematic views of the base fastener according to the fourth embodiment of the present invention. As shown in FIGS. 7, 8a, 8b, 9a and 9b, some structures of the fourth embodiment are identical to those of the first embodiment and will not be described again here. The difference is that, in the fourth embodiment, the body 21 further comprises a positioning part 22 and a hole 23. The positioning part 22 has a positioning end 221 and an operating end 222. The positioning end 221 of the positioning part 22 may be in the shape of a hemisphere, an arc, or a slope. The hemispherical shape is used as an example for explanation in the current embodiment, but not limited to this. For the positioning enhancement in the current embodiment, the positioning end 221 further has a contact plane 2211. A connecting portion 223 is disposed between the positioning end 221 and the operating end 222. The positioning part 22 penetrates through the hole 23 and connects to the body 21 through the connecting portion 223. The positioning end 221 and the operating end 222 are both exposed out of the hole 23. The base 1 has a positioning portion 12 corresponding to the positioning end 221.

Please refer to FIGS. 8a and 8b again. The positioning portion 12 is a recessed hole. When the body 21 is rotated such that the positioning end 221 of the positioning part 22 of the body 21 falls into the positioning portion 12 (i.e., the recessed hole), the body 21 is confined without separation from the base 1 due to reverse rotation (refer to FIG. 8a). If the user wants to detach the body 21, the operating end 222 of the positioning part 22 is operated such that the contact plane 2211 of the positioning end 221 of the positioning part 22 is detached from the portion engaged with the interior of the positioning portion 12 (shown in FIG. 8b).

Please refer to FIGS. 9a and 9b again. The positioning portion 12 is an outward-projecting protrusion. When the body 21 is rotated such that the positioning end 221 of the positioning part 22 of the body 21 is constrained horizontally by the positioning portion 12 (i.e., the outward-projecting protrusion), the body 21 is confined without separation from the base 1 due to reverse rotation (refer to FIG. 9a). If the user wants to detach the body 21, the operating end 222 of the positioning part 22 is operated such that the contact plane 2211 of the positioning end 221 of the positioning part 22 is detached from the portion projecting and engaged with the positioning portion 12 (shown in FIG. 9b).

Figure 8A:
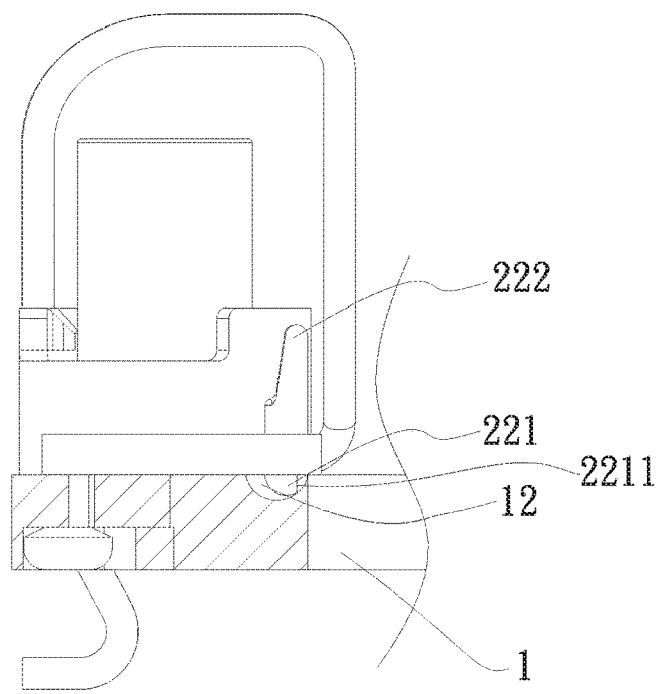
FIG. 8a is a schematic view of the base fastener of the present invention.
Figure 8B:
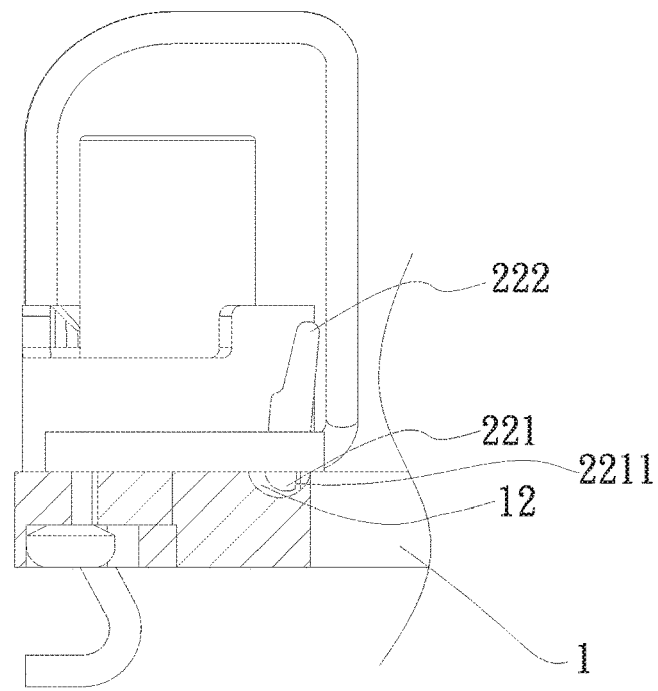
FIG. 8b is a schematic view of the base fastener of the present invention.
Figure 9A:
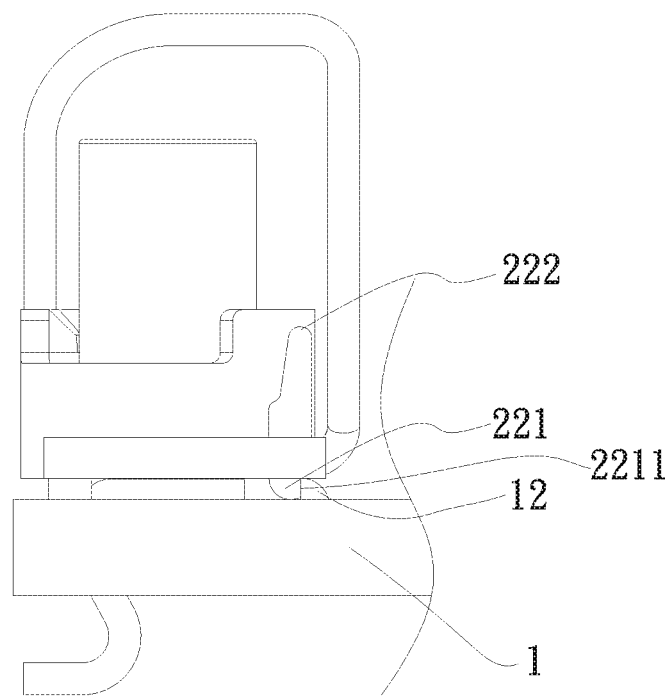
FIG. 9a is a schematic view of the base fastener of the present invention.
Figure 9B:
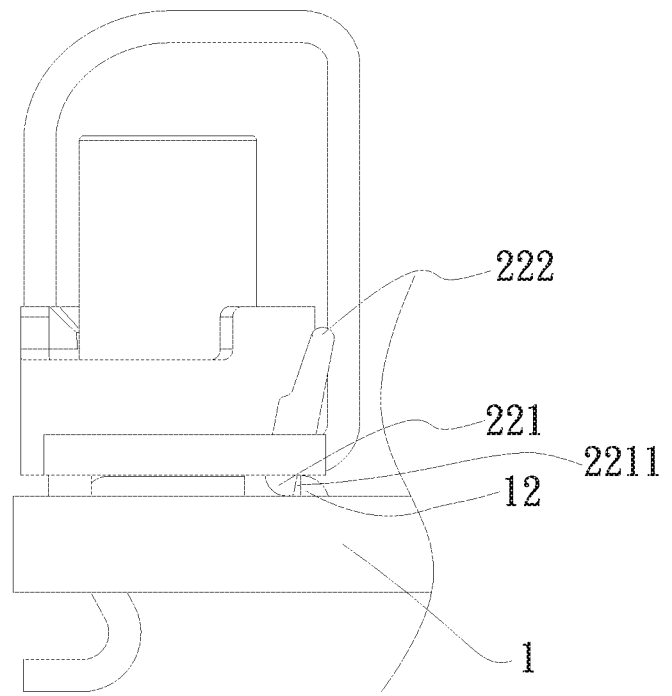
FIG. 9b is a schematic view of the base fastener of the present invention.

As explained in the previous embodiment, the positioning portion 12 can be a recessed hole shown in FIG. 8a or an outward-projecting protrusion shown in FIG. 9a. The corresponding configuration of recess-projection or projection-projection between the positioning portion 12 and the positioning end 221 enables the mutual constraint of the positioning portion 12 and the positioning end 221, which achieves the secure positioning of the combination of the body 21 and the base 1 through rotating movement.

The present invention can quickly assemble or disassemble the base fastener (e.g., the traditional nut washer) and the base or any other heat-dissipating/heat-transfer device through rotating movement to overcome the disadvantage in fixing the nut washer to the base. Further, the assembly time can be reduced and the reworking can be performed anytime.

What is claimed is:

1. A base and fastener assembly comprising:
   a base having an opening and a pair of arcuate holes arranged on opposite sides of the opening, each of the arcuate holes having a first arc position and a smaller second arc position; and
   a fastener having:
      a first side,
      an opposite second side,
      a through-hole penetrating between the first and second sides,
      a first post extending from the second side adjacent the through-hole, and
      a second post extending from the second side adjacent the through-hole and opposite the first post, wherein the first and second posts each extend through the first arc positions of the pair of arcuate holes and rotate toward and engage the second arc positions such that the fastener is held against the base and restrained against rotational and axial movement with respect to the base.

2. The base and fastener assembly of claim 1, wherein each arcuate hole defines a narrowed neck portion arranged intermediate the first and second arc positions and having a width smaller than the second arc position.

3. The base and fastener assembly of claim 1, wherein the first and second posts each define a post diameter no greater than the second arc position and an end having a width greater than the second arc position and less than the first arc position.

4. The base and fastener assembly of claim 1, wherein the base further comprises a positioning portion and wherein the fastener further comprises a positioning part selectively engaged with the positioning portion.

* * * * *